United States Patent [19]

Gill

[11] Patent Number: 5,150,179
[45] Date of Patent: Sep. 22, 1992

[54] DIFFUSIONLESS SOURCE/DRAIN CONDUCTOR ELECTRICALLY-ERASABLE, ELECTRICALLY-PROGRAMMABLE READ-ONLY MEMORY AND METHOD FOR MAKING AND USING THE SAME

[75] Inventor: Manzur Gill, Rosharon, Tex.

[73] Assignee: Texas Instruments Incorporated, Dallas, Tex.

[21] Appl. No.: 548,045

[22] Filed: Jul. 5, 1990

[51] Int. Cl.[5] .......................................... H01L 29/68
[52] U.S. Cl. .................................... 357/23.5; 357/45; 357/53; 365/185
[58] Field of Search ...................... 357/23.5, 53, 45; 365/185

[56] References Cited

U.S. PATENT DOCUMENTS

| | | | |
|---|---|---|---|
| 4,041,519 | 8/1977 | Melen | 357/30 |
| 4,203,158 | 5/1980 | Frohman-Bentchkowsky et al. | 357/185 |
| 4,240,195 | 12/1980 | Clemens et al. | 29/571 |
| 4,373,250 | 2/1983 | Malwah | 29/571 |
| 4,377,818 | 3/1983 | Kuo et al. | 357/23 |
| 4,493,057 | 9/1982 | McElroy | 365/182 |
| 4,590,504 | 5/1986 | Guterman | 357/23.11 |
| 4,652,897 | 3/1987 | Okiyama et al. | 357/23.5 |
| 4,668,970 | 5/1987 | Yatsuda et al. | 357/23.5 |
| 4,686,558 | 8/1989 | Adam | 357/42 |
| 4,780,424 | 10/1988 | Holler et al. | 437/29 |
| 4,947,222 | 8/1990 | Gill et al. | 357/23.5 |
| 5,025,494 | 6/1991 | Gill et al. | 357/23.5 |
| 5,063,171 | 11/1991 | Gill | 437/41 |

FOREIGN PATENT DOCUMENTS 105802 4/1984 European Pat. Off. .
144900 6/1985 European Pat. Off. .
8501146 3/1985 PCT Int'l Appl. .

Primary Examiner—Andrew J. James
Assistant Examiner—Sara W. Crane
Attorney, Agent, or Firm—W. James Brady, III; Lawrence J. Bassuk; Richard L. Donaldson

[57] ABSTRACT

A diffusionless source/drain conductor, electrically-erasable, electrically-programmable read-only memory cell is formed at a face of a semiconductor layer (38) of a first conductivity type and includes a source conductor (10), a drain conductor (12), a channel region (18), and a tunnel region (22). Source conductor (10) and drain conductor (12) are disposed to create inversion regions, of a second conductivity type, opposite said first conductivity type, in the source inversion region (14) and drain inversion region (16) of semiconductor layer (38) of the layer semiconductor, upon application of voltage. Thin oxide tunneling window (22) is disposed adjacent source conductor (10). A floating gate (24) disposed adjacent tunneling window can be charged or discharged by Fowler-Nordheim tunneling when a voltage is applied between the inversion created in source inversion region (14) and a control gate (26) insulatively adjacent floating gate (24).

41 Claims, 4 Drawing Sheets

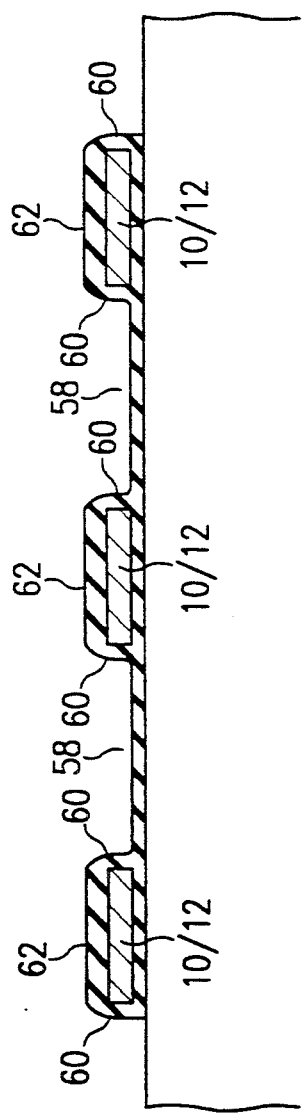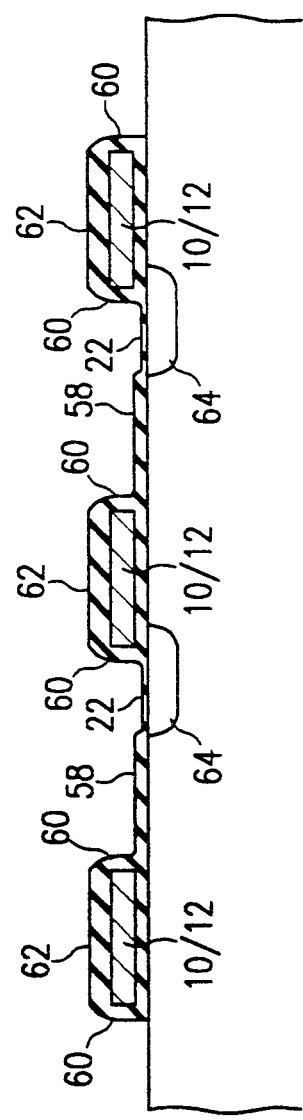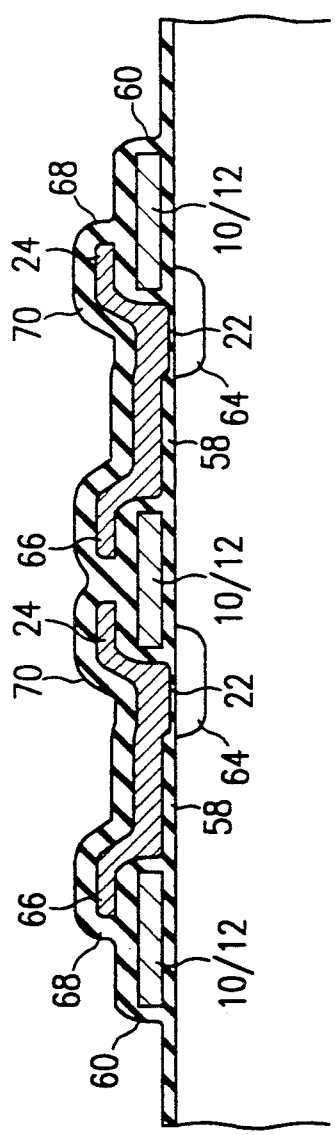

DIFFUSIONLESS SOURCE/DRAIN CONDUCTOR ELECTRICALLY-ERASABLE, ELECTRICALLY-PROGRAMMABLE READ-ONLY MEMORY AND METHOD FOR MAKING AND USING THE SAME

TECHNICAL FIELD OF THE INVENTION

The present invention relates generally to memory devices, and more particularly to diffusionless source/-drain conductor, electrically-erasable, electrically-programmable read-only memories, and methods of manufacture and use of such devices.

BACKGROUND OF THE INVENTION

EEPROMs or electrically-erasable, electrically-programmable ROMs, typically consist of an array of MOSFETs with a floating gate in case of double poly structure or with MNOS in case of single poly structure. In case of double poly floating gate structure, a typical cell consists of a substrate of a specified conductivity type with two heavily doped regions of an opposite conductivity type, formed on its face. The heavily doped regions, designated the drain and the source, are separated by a channel region. A thin oxide layer is grown on the surface of the channel and a floating gate is then formed on the thin oxide. A control gate, separated by a layer of an insulator, is formed across the floating gate.

To program the cell, appropriate voltages are applied to the source, drain and control gate to cause the floating gate to be charged by either hot electron injection or Fowler-Nordheim tunneling. The cell is read by placing proper read voltages on the source, drain and control gate, and sensing the current flow between the source and the drain. The channel of a programmed cell (a cell with a negative charge on the floating gate) will not conduct, storing a logic zero. Typically, EEPROM cells are erased by discharging the floating gate by applying erase voltages between the control gate, source, and drain, and discharging the floating gate by Fowler-Nordheim tunneling. The channel of an erased cell (a cell with zero or positive charge on its floating gate) will conduct, storing a logic one.

The formation of the source and drain diffused regions requires several steps. A conventional set of these steps includes defining the areas of the substrate in which the diffusion will be performed by depositing and patterning a photoresist on the overlying oxide layer and then etching the exposed oxide away. Then, following definition of the boundaries of the prospective diffused regions, the actual implant must be made. Thus, by eliminating heavily doped diffused source and drain regions, the process of manufacturing transistors can be simplified.

The advantages of reduced processing steps are greatly magnified when an array, such as a memory array, is being contemplated. The elimination of the source and drain diffusions will allow the array to be more scalable, with a consequent improvement in memory cell density. Further improvement in cell density can be achieved if adjacent cells can be electrically isolated from each other without intervening physical structure such as layers of insulator and/or channel stop implantations. Many prior art devices have relied on thick field oxide regions and channel stops to isolate adjacent columns of cells to avoid read and write disturb. Providing columns of cells which are self-isolating will allow elimination of these structures, allowing increased cell density on the chip since less space will be expended on isolating structure such as oxide regions and channel stops.

SUMMARY OF THE INVENTION

According to the invention, a diffusionless source/-drain conductor, electrically-erasable, electrically-programmable read-only memory cell array is formed at a face of a layer of semiconductor. A thin insulator layer is formed overlying at least a channel region portion of the semiconductor layer. A source conductor is formed to control and define a source inversion region of the semiconductor layer while a drain conductor is formed to control and define a drain inversion region of the semiconductor layer. The source and drain conductors are spaced from each other to define a channel region of the semiconductor layer between the source inversion region and the drain inversion region. A thin oxide tunneling window is disposed in the channel adjacent the source inversion region. A floating gate overlies at lest a portion of the channel to control its conductance and the thin oxide tunneling window for Fowler-Nordheim tunneling. A gate conductor is formed insulatively adjacent the floating gate.

At least one voltage source is coupled to the drain and source conductors for inverting the source and drain inversion regions to a second conductivity type opposite the first conductivity type of which the semiconductor layer is formed. By creating a voltage difference between the control gate and the inversion created in the source inversion region, the floating gate may be programmed or erased through Fowler-Nordheim tunneling.

In a preferred embodiment, an array of diffusionless source/drain conductor electrically-erasable, electrically-programmable read-only memory cells are formed at a face of a semiconductor layer of a first conductivity type. A thin insulator is formed overlying the layer of semiconductor. A plurality of parallel, elongated drain conductors are formed overlying the thin insulator layer. For each drain conductor, an elongated source conductor is formed substantially in parallel thereto spaced by a channel region. For each cell, a thin oxide tunneling window is formed in the channel region adjacent the source conductor. For each cell, a floating gate is disposed adjacent the channel area and the thin insulator window. A plurality of elongated control gate conductors are formed at an angle to insulatively intersect the source and drain conductors with each control gate conductor insulatively overlying the floating gates of a row of cells.

The present invention presents distinct advantages over prior art EEPROM cells. The conventional source and drain diffused regions have been eliminated. Only small diffusion regions are required to control the voltages of the induced inversion regions. In an array of such cells, only one small diffusion region is required for every 8, 16, 32 or 64 cells. Further, the present cell is self-isolating. When no voltage is applied to the source and drain conductors, no inversions are created, and thus, no electrical path can be created between adjacent cells. The need for field oxide isolation between adjacent columns of cells has been eliminated, reducing cell area. In other words, by eliminating field oxide, the cell has become more scalable.

BRIEF DESCRIPTION OF THE DRAWINGS

Other aspects of the invention and their advantages will be discerned when one refers to the following detailed description as taken in conjunction with the drawings, in which:

FIGS. 3 through 8 show subsequent progressive fabrication steps as taken substantially along line 8—8 of FIG. 1;

FIG. 11 is an electrical schematic diagram of a small section of an array of cells according to the invention.

DETAILED DESCRIPTION OF THE INVENTION

Figure 1:
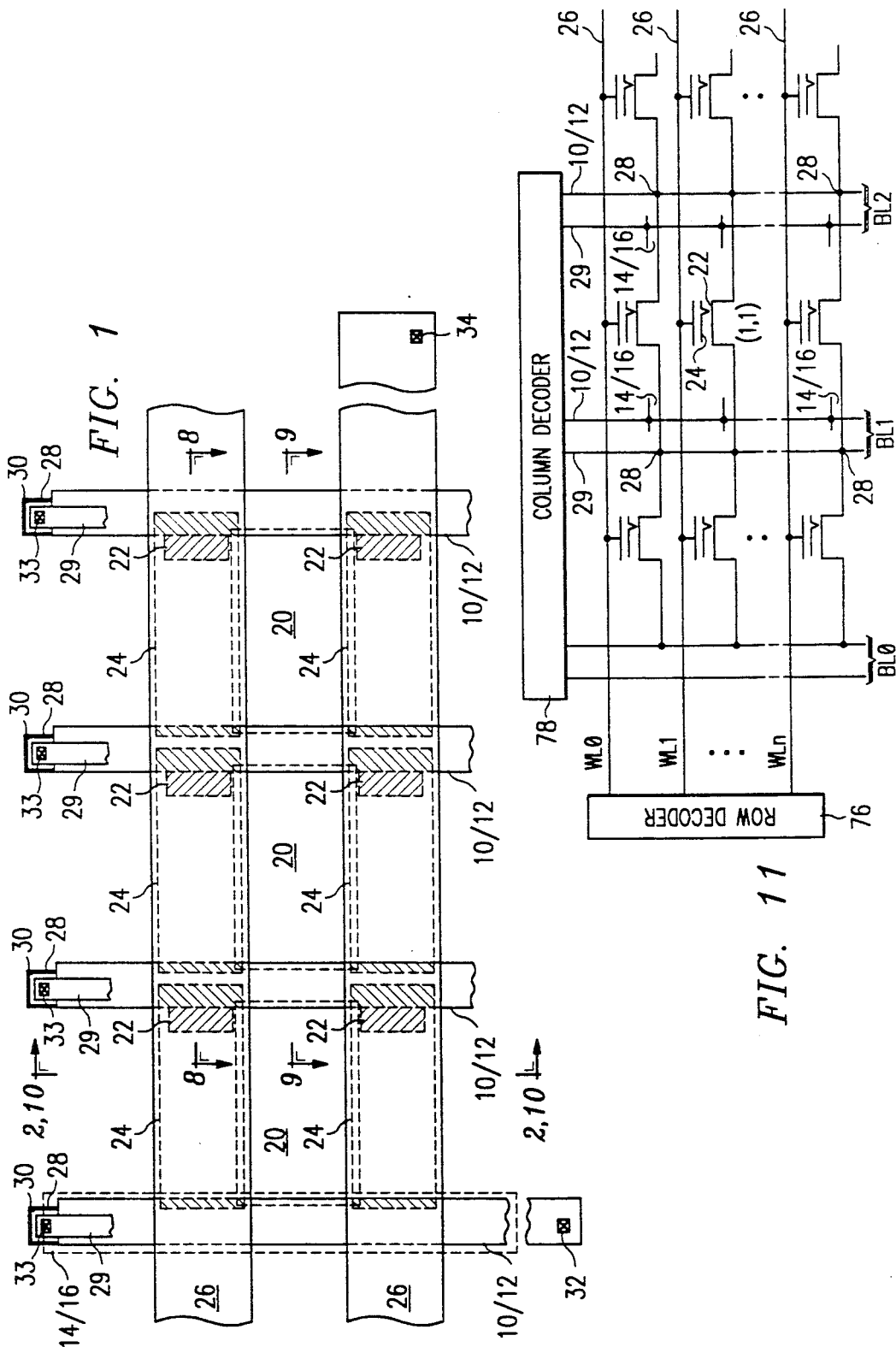
FIG. 1 is a plan view of a small section diffusionless conductor EEPROM array according to the invention, selected structure such as cell encapsulation has been removed for clarity.

The structure and fabrication of a diffusionless conductor electrically-erasable and programmable read-only memory cell will be described first, followed by the operation of such a cell in a memory array. A plan view of an array diffusionless conductor EEPROMs cell according to the invention is shown in FIG. 1. Selected structure, such as cell encapsulation (described below) has been omitted for the sake of clarity.

Each column of cells in FIG. 1 includes an elongated source conductor 10 and an elongated drain conductor 12. In the array configuration, the source conductor 10 of one column of cells becomes drain conductor 12 of the adjacent column cells and so forth. The conductors are thus labeled 10/12 in FIG. 1. For clarity, the designations source conductor 10 and drain conductor 12 will be used to describe a single cell in the array. Source conductor 10 and drain conductor 12 are formed of highly doped polycrystalline silicon. Source conductor 10 overlies a source inversion region 14 and drain conductor 12 overlies a drain inversion region 16. The boundaries of inversion regions 14 and 16 are shown by dashed lines in FIG. 1. As with source conductor 10 and drain conductor 12, the inversion regions are labelled 14/16 to indicate their dual source/drain role in the operation of the array.

The source conductor 10 and drain conductor 12 forming each column of cells, are separated by a channel region 18. Field oxide regions 20 are formed perpendicular to conductors 10 and 12 and separate the channels of cells in the adjacent rows. For each cell in the column, a small thin oxide tunneling window 22 is disposed in channel region 18 adjacent source conductor 10. A floating gate 24 is formed across each tunneling window 22 and an elongated control gate 26 is subsequently formed overlying each floating gate 24 in a row of cells at an angle to the columns of cells. The control gate is insulated from the floating gate.

Voltage control diffusion regions 28 are provided periodically along each source/drain conductors 10/12 to selectively apply voltages to source/drain inversion regions 14/16. For example, one voltage control diffusion region 28 may be provided along a respective source/drain conductors 10/12 for every 8, 16, 32 or 64 cells in the column. In a preferred embodiment, voltage control diffusion regions 28 are buried under differentially grown oxide layers 30. A contact 32 is provided to selectively apply voltages to each source/drain conductor 10/12, while a contact 34 is provided to each elongated control gate 26. Contact 33 connects voltage control diffusion region 28 to a metal line 29.

Figure 2:
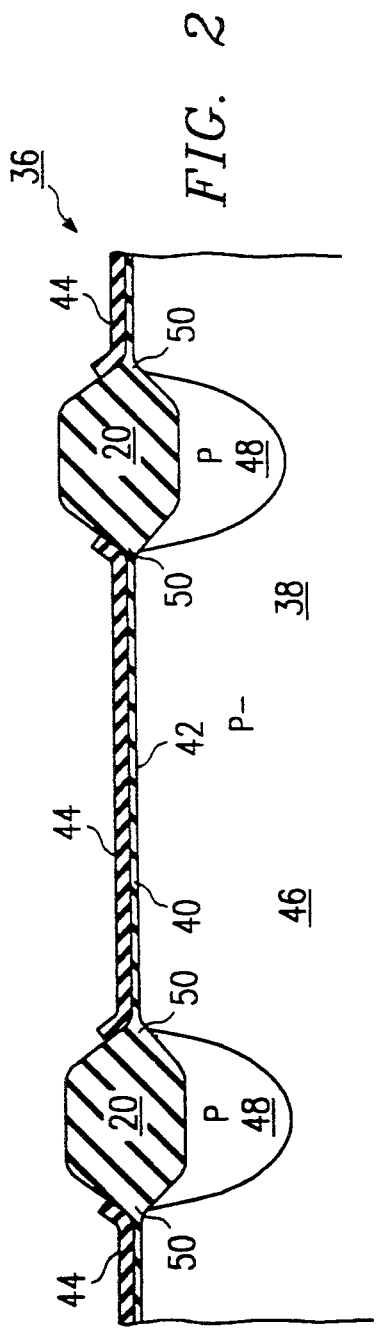
FIG. 2 is a greatly enlarged schematic elevational sectional view of a semiconductor workpiece showing the initial stage in the fabrication of a diffusionless conductor EEPROM according to the invention as taken substantially along line 2—2 of FIG. 1.

Referring next to FIG. 2, which is a sectional view corresponding to line 2—2 of FIG. 1, a semiconductor substrate or layer 36 is shown having a (p−) epitaxial layer 38 grown thereon. A layer 40 of oxide is deposited or grown on a surface 42 of (p−) region 38. This is followed by the deposition of a nitride layer 44 on top of the oxide layer 40. The nitride layer 44 is patterned and etched to define an active device area 46 over which it resides.

A boron implant (a dose of about $8 \times 10^{12}$ cm$^{-2}$) is then performed to create (P) channel stop regions 48. Then, thick field oxide regions 20 are thermally grown using a localized oxidation process to a thickness of approximately 9000 Angstroms by exposing the substrate to steam at about 900° C. using any of several conventional techniques. The thermal oxide regions 20 grow beneath the edges of adjacent nitride layers 44, creating bird's beaks 50 instead of sharp transitions.

Nitride layer 44 and oxide layer 40 are then removed. At this point, in a first fabrication option, small voltage control diffusion regions (see FIG. 1) may be formed. A layer (not shown) of photoresist is deposited and patterned to act as an implant mask for an arsenic implant at a dose of approximately $6 \times 10^{15}$ cm$^{-2}$ and at an energy of about 135 KeV.

Figure 3:
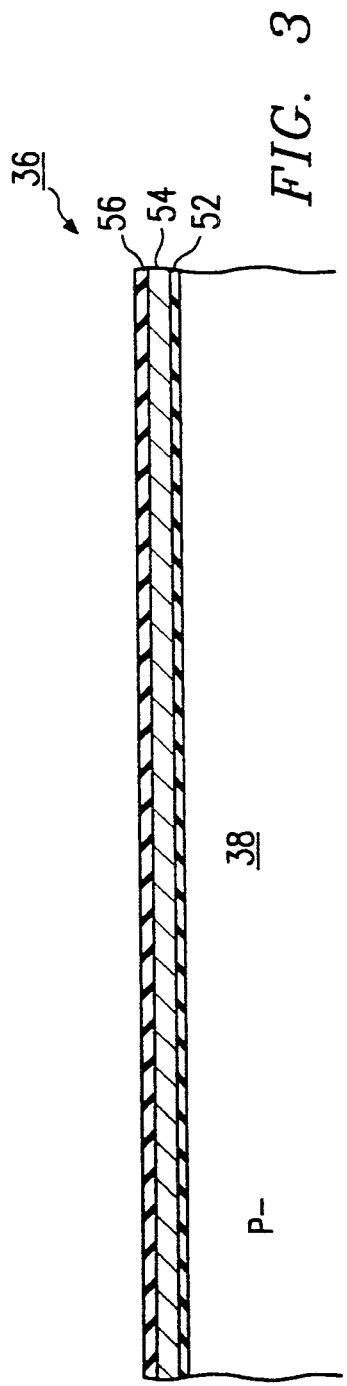

Referring next to FIG. 3, which is a sectional view corresponding to line 8—8 in FIG. 1, as are FIGS. 4, 5, 6, 7 and 8 to follow, a layer 52 of oxide (200–500 Å) is then grown across the surface of epitaxial layer 38. If the first fabrication option is selected, thick dopant-enhanced oxide regions 30 (2,000–4,000 Å) (see FIG. 1) will be grown in voltage control diffusion regions 28 during the formation of oxide layer 52.

Oxide regions 30 grow at a faster rate than oxide layer 52 because of the impurity in voltage control diffusion regions 28, and hence are known as differentially grown oxides.

A layer 54 of polycrystalline silicon (polysilicon) is deposited to a thickness of approximately 3500 Angstroms. The polysilicon layer 54 (also known as the "poly 1" layer) is heavily doped to render it conductive. This may be accomplished, for example, by removing any oxide existing on poly 1 layer 54 and then exposing the polysilicon to POCl$_3$ at 900°–950° C. for approximately 15 minutes followed by deglazing, and/or doping the poly layer with arsenic implant. A layer 56 of oxide/nitride is then deposited across the face of poly 1 layer 54.

Figure 4:
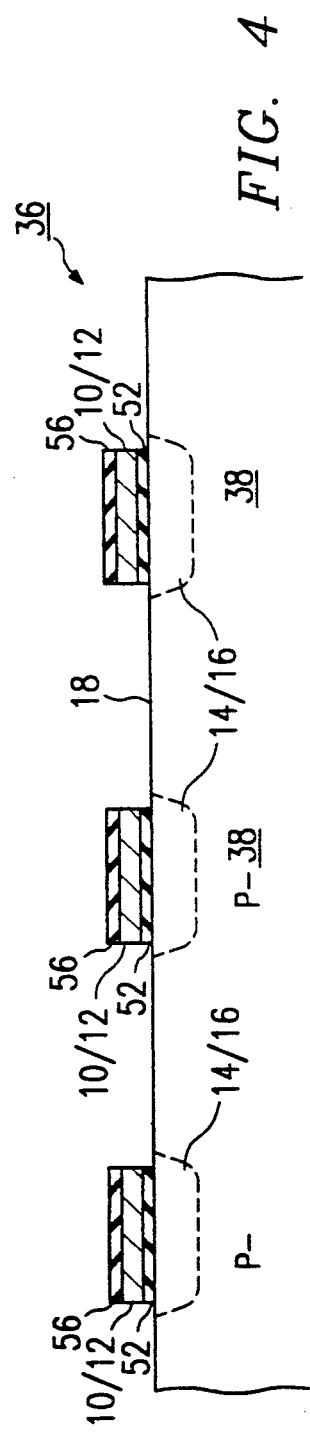

Referring next to FIG. 4, oxide/nitride layer 56 and poly 1 layer 54 are then patterned and etched to define a plurality of cells each having a source conductor 10 and a drain conductor 12, indicated for an adjacent pair of cells as source/drain conductors 10/12. Source conductor 10 overlies and defines a source inversion region 14 of epitaxial layer 38, while drain conductor 12 overlies a drain inversion region 16 of epitaxial layer 38. Inversion regions are indicated as 14/16 for the adjacent pairs of cells indicating their dual role depending on the operation of a selected individual cell. The approximate boundaries of these inversion regions are shown by dotted lines in FIGS. 1 and 4. The source/drain conductors 10/12 are spaced apart to define a channel region 18 for each cell.

In a second alternative fabrication option, voltage control regions 28 can be formed at this point using the edges of source/drain conductors 10/12 for alignment. A layer of photoresist (not shown) is deposited and patterned to complete an implant mask for an arsenic implant at a dose of about $6 \times 10^{15}$ cm$^{-2}$ and at an energy of about 135 KeV. The resulting diffusion regions 28 can then be "driven" under the edges of source/drain conductors 10/12 by exposure to a temperature of about 900°-1000° C. for about an hour. If the first fabrication option has been selected, the terminal portions of source/drain conductors 10/12 already overlie respective portions of voltage control regions 28.

Referring next to FIG. 5, gate oxide 58 (200–400 Å) is grown across channel region 18. During the formation of gate oxide 58, oxides 60 are grown on the edges of source/drain conductors 10/12. Additionally, oxide/nitride layer 56 (see FIG. 4) is converted into an oxide/nitride/oxide layer 62.

Referring next to FIG. 6, a window is opened in oxide 58 adjacent source/drain conductors 10/12. This is done by etching a window through oxide 58 to the silicon using photoresist as a mask. The window is opened adjacent the edge of source/drain conductors 10/12. A thinner oxide (or nitrided oxide as known in the art) layer is then grown to approximately 80-90 Angstroms thick to form tunneling window 22. At the time this oxidation occurs, oxide layer 58 will grow thicker to approximately 350 Angstroms, depending on its thickness before the step. Also, the poly edge adjacent the tunnel window will be oxidized. The poly edge oxide will provide isolation between conductor 10/12 and the tunnel window region. A light phosphorus (an approximate range to $1 \times 10^{13}$ to $1 \times 10^{15}$) implant 64 is performed through tunnel w 22, prior to oxidation, to assure electrical connection between the tunnel diode and the source/drain inversion regions 14/16 to improve field plate breakdown of the tunnel diode and improve the performance of the cell.

Referring to FIG. 7, a second polycrystalline silicon layer 66 ("poly 2") is next deposited over the face of the slice, and is heavily doped to be (n+). An etch is next performed on poly 2 layer 66 to define a floating gate 24 for each cell.

After removing the photoresist, sidewall oxides 68 are then formed along the edges of floating gates 24 using a conventional method. An oxide/nitride layer is next deposited, and converted into an oxide/nitride/oxide (ONO) layer 70 by a conventional oxidation method. The effective oxide thickness of ONO 70 layer is a trade off between adequate control gate to floating gate capacitive coupling, and low leakage across ONO 70.

Figure 8:
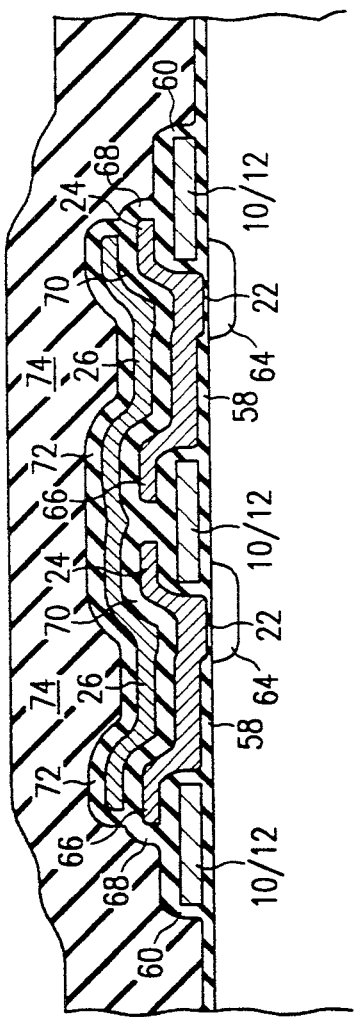

Referring next to FIG. 8 which depicts a pair of adjacent cells, a third polycrystalline silicon layer 26 ("poly 3") is next deposited over the face of the slice and is heavily doped to be (n+). Next, a stack etch of (1) the third poly silicon layer 26, (2) oxide/nitride/oxide layer 70, and (3) floating gate 24 is performed. The pair of cells is demonstrative of any adjacent pair in an array, such that when an array of memory cells according to the invention is being fabricated, this stack etch defines a plurality of elongated wordline conductors 26 that run substantially parallel to each other in an x-direction, and are spaced apart from one another in a y-direction, perpendicular to the paper in FIG. 8. FIG. 8 depicts the elongated control gate 26 as it controls the pair of adjacent cells. This same stack etch separates and defines the floating gate conductors 24 in a y-direction. Peripheral logic CMOS devices (not shown) may be completed using a standard technique, and has not been discussed here for clarity. An oxide layer 72 is grown after this process on the sides and top of the stack for enhanced data retention.

A borophosphosilicate glass (BPSG) layer 74 is next deposited over the face of the wafer. Windows are then opened to expose voltage control regions. Metal lines 29a and 29b are then deposited (see FIG. 1). Metal contacts (see FIG. 1) are made through the BPSG layer 74 to the source/drain conductors 10/12. Additionally, metal contact 34 is made through the BPSG layer 74 to gate conductor 26.

Figure 9:
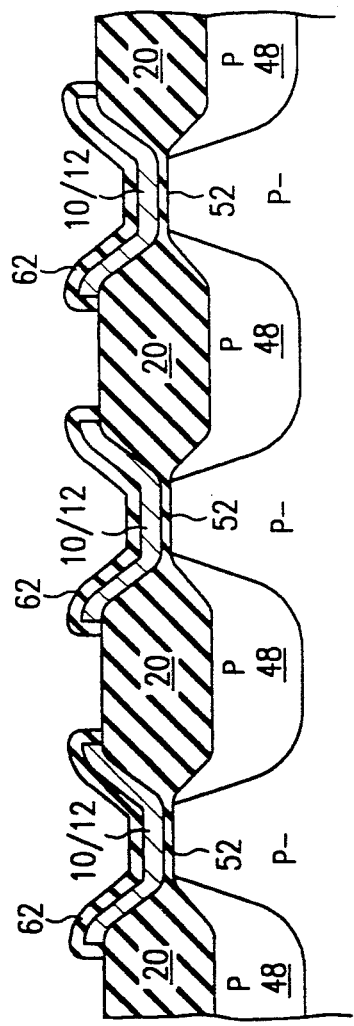
FIG. 9 is a sectional view of a completed MOSFET taken substantially along line 9—9 of FIG. 1, selected structure being removed for clarity.

FIG. 9 is a sectional view of a completed device taken substantially along line 9—9 of FIG. 1, selected structure such as BPSG layer 74 having been removed for clarity.

Figure 10:
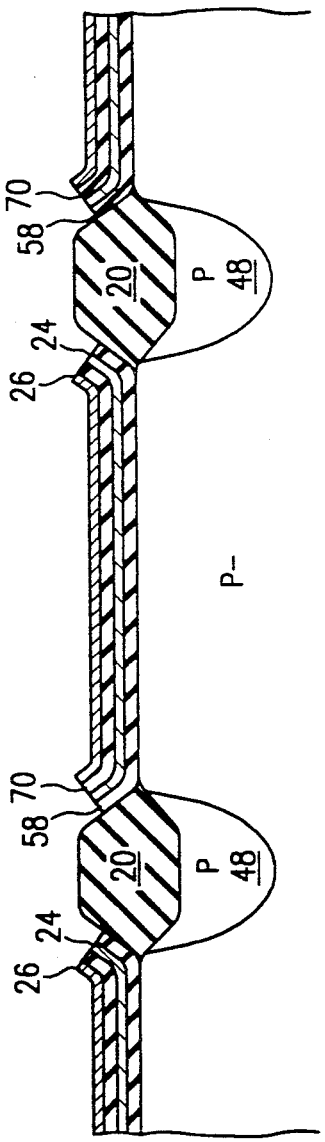
FIG. 10 is a sectional view of a completed MOSFET taken substantially along line 10—10 of FIG. 1 selected structure being removed for clarity.

FIG. 10 is a sectional view taken substantially along the line 10—10 of FIG. 1. Selected structure such as BPSG layer 74 has been removed for clarity.

FIG. 11 is an electrical schematic diagram of a memory array of diffusionless conductor EEPROM cells formed in columns and in rows according to the invention, only nine cells being shown for clarity. In FIGS. 1-11, like characters identify like parts so that the structural components of the EEPROM cells and their electrical representations may be compared. Each row of cells is provided with a wordline conductor WL0, WL1 or WLn, comprised of gate conductors 26. Gate conductors 26 are controlled by row (wordline) decoder 76. Each column of cells is provided with two bitlines such as BL0 and BL1, comprised of source/drain conductors 10/12, and the associated metal lines 29 controlling the voltage control diffusion regions 28 provided for the cells in the column. The bitlines are controlled by a column decoder 78. Each source/drain conductor 10/12 is depicted with a corresponding voltage control diffusion region 28 at cells formed at rows corresponding to WL0 and WLn.

Using cell (1,1) as designated in FIG. 12, as an example, operation of an array of EEPROM memory cells according to the invention will be described.

In the write or program mode, row decoder 76 applies a voltage $V_{pp}$ of approximately 14 to 18 volts to the elongated control gate conductor 26 forming the selected row containing the cell (1,1), in this case, WL1. Row decoder 76 applies a lower voltage, approximately +7 volts, to the deselected wordlines, in this case, WL0 and WLN. Column decoder 78 applies an inversion control voltage of approximately +5 volts to the source/drain conductors 10/12 of the selected cell, in this case source/drain conductors 10/12 forming part of bitline BL2. The application of an adequate inversion control voltage to the selected source/drain conductors 10/12 creates an inversion layer in the source inversion region 14. In a p− epitaxial layer 38, this inversion layer approximates an n+ diffusion region of a conventional EEPROM cell. All the deselected source/drain conductors 10/12 are at ground (zero volt) potential or allowed to float.

Column decoder 78 then applies a source voltage of approximately 0 volts to the metal line 29 terminating in voltage control diffusion region 28 adjacent the source inversion region of the selected cell, in this case the metal line 29 forming part of BL2 bitline. The deselected metal lines 29 may be held at ground. The differences in voltage between the gate conductor 26 and the source inversion region 14 of cell (1,1) causes the floating gate 24 of cell (1,1) to be charged through Fowler-Nordheim tunneling. The charging of floating gate 24 raises the threshold voltage of the cell (1,1), thereby storing a logic zero. In the case of deselected cells on the selected wordline WL1, no voltage drop occurs across the tunnel oxide, hence no tunneling occurs across the tunnel oxide. Thus, the half select nature of cells described in co-pending application Ser. No. 07/494,042, filed Mar. 15, 1990, now U.S. Pat. No. 5,0078,721, which is a continuation of application Ser. No. 07/219,529, filed Jul. 15, 1988, now abandoned has been eliminated, providing a wider operating window during programming.

To read cell (1,1), the impedance of channel 18 is sensed. Column decoder 78 applies an inversion control voltage of approximately +5 volts to the source/drain conductors 10/12 of the column containing cell (1,1), in this case, the source/drain conductors 10/12 forming respective parts of bitlines BL1 and BL2. The application of an adequate inversion control voltage to the conductors creates inversion layers in the source inversion region 14 and the drain inversion region 16. In a p— epitaxial layer, these inversion layers approximate n+ diffusion regions of a conventional EEPROM cell. A low voltage (zero volt) is applied to the remaining source/drain conductors 10/12 in the array, effectively isolating the selected column from the deselected columns.

A source voltage of approximately 0 volts is applied to metal line 29 terminating in voltage control diffusion region 28 adjacent the source inversion region 14, in this case the metal line 29 forming part of bitline BL2. A voltage of approximately 1.5 volt is applied to metal line 29 terminating in voltage control diffusion region 28 adjacent drain inversion region 16, in this case the metal line 29 forming part of bitline BL1. A voltage difference is thereby created between the inversion in source inversion region 14, and the inversion in drain inversion region 16.

Row decoder 76 applies a gate voltage of approximately 3-5 volts to the elongated gate conductor 26 forming the row containing the cell (1,1), in this case, WL1. If floating gate 24 is charged, the voltage applied to control gate 26 will not exceed the threshold voltage of channel 18, and no current flow will be sensed between voltage control inversion region 28 along bitline BL1 and voltage control inversion region 28 along bitline BL2. If, on the other hand, floating gate 24 is not charged, the voltage applied to control gate 26 (wordline WL1), will exceed the threshold voltage of channel 18 and current flow will be sensed between the respective voltage control inversion regions 28 and 28

In the bulk or flash erasing mode, column decoder 78 applies a voltage of approximately +5 volts to all the source/drain conductors 10/12 in the array. Inversion regions are created in each of the source/drain inversion regions 14/16. Column decoder 78 also applies a voltage of approximately +5 volts to each of the metal lines 29 terminating in the respective voltage control diffusion regions 28 in the array. Row decoder 76 applies a voltage of approximately −8 to −12 volts to each of the elongated control gates 26 (wordlines) in the array. The charged floating gates 24 in the array are then discharged by Fowler-Nordheim tunneling, thereby erasing the array.

Similarly, in the bit or byte or page erase mode, column decoder 78 applies a voltage of approximately +5 V to the source/drain conductors 10/12 including a group of cells to be erased. Row (wordline decoder) 76 applies a voltage of −7 to −12 V to the selected rows (wordlines) including the cells to be erased while applying zero volts or ground to the deselected wordlines.

In summary, an EEPROM cell which does not require source and drain diffusions has been provided. Field oxides and channel stops, used in conventional EEPROMs for electrically isolating adjacent columns of cells can be eliminated. The diffusionless EEPROM cell eliminates half select nature of deselected cells during programming, providing wider operating margin. The fabrication of the cells is also simplified since the diffusions in the vicinity of the cells are not required. Thus, the present invention has distinct advantages over prior art EEPROMs.

While preferred embodiments of the invention and their advantages have been set forth in the above detailed description, the invention is not limited thereto, but only by the scope and spirit of the appended claims.

What is claimed is:

1. A contactless diffusionless source/drain conductor electrically-erasable and programmable read-only memory cell formed at a face of a semiconductor layer of a first conductivity type, comprising:

first and second conductors, formed overlying portions of said semiconductor layer, and separated to define a channel region therebetween, a thin insulator layer formed across at least said channel region of said semiconductor layer, said first conductor controlling and defining a drain inversion region in said semiconductor layer, said second conductor controlling and defining a source inversion region in said semiconductor layer;

a thin insulative tunneling window formed on said semiconductor layer adjacent said second conductor;

a floating gate conductor overlying said thin insulative tunneling window for establishing a Fowler-Nordheim tunnel current path from said source inversion region and disposed over at least a portion of said channel region for controlling channel conductance in the last said portion;

a control gate conductor insulatively overlying said floating gate; and first and second diffused regions of a second conductivity type opposite said first conductivity type formed in said semiconductor layer remote from said memory cell, said first diffused region formed adjacent said drain inversion region, said second diffused region formed adjacent said source inversion region.

2. The memory cell of claim 1, and further comprising thick insulator regions formed adjacent said floating gate and said control gate on opposing sides of said channel, said thick insulator regions adapted to isolate said cell from like adjacent cells.

3. The memory cell of claim 1, wherein said first and second conductors are formed of polycrystalline silicon.

4. The memory cell of claim 1, wherein said floating gate extends over the entire said channel region.

5. The memory cell of claim 1, wherein said semiconductor layer comprises silicon.

6. The memory cell of claim 5, wherein said first conductivity type is p and said second conductivity type is n.

7. An array of source/drain diffusionless electrically-erasable and programmable read-only memory cells formed at a face of a semiconductor layer of a first conductivity type, comprising:
- a layer of tin insulator formed across the face of said semiconductor layer;
- a plurality of parallel, elongate first conductors formed overlying said layer of thin insulator, a column of memory cells associated with each pair of adjacent parallel, elongate first conductors;
- for each cell, a channel region at said face of said semiconductor layer separating an adjacent pair of said parallel, elongate first conductors;
- for each cell, a thin oxide tunneling window overlying a respective one of said channel regions and adjacent a respective one of said parallel, elongate first conductors;
- for each cell, a floating gate conductor overlying said thin oxide tunneling window and insulatively overlying at least a portion of said respective channel region;
- a plurality of rows of said cells formed at an angle to said parallel, elongate first conductors, a control gate conductor for each said row insulatively disposed adjacent said floating gate conductors in said row so as to be electrically coupled thereto when preselected voltages are applied to said control gate conductor;
- for each parallel, elongate first conductor, at least one diffused region of a second conductivity type opposite said first conductivity type, formed in the semiconductor layer adjacent said parallel, elongate first conductor.

8. The array of claim 7, and further comprising a plurality of thick insulator regions formed between adjacent ones of said rows to electrically isolate the channel regions of adjacent rows of said cells.

9. The array of claim 7, and further comprising second conductors coupled to said diffused regions and adapted to apply voltages created by remote means thereto.

10. The array of claim 7, and further comprising differentially grown oxides formed over said diffused regions.

11. A method of programming an electrically-erasable and programmable read-only memory cell having a source conductor and a drain conductor formed at a face of a layer of a semiconductor, the source conductor and the drain conductor separated by a channel, a thin oxide tunneling window formed in the channel adjacent the source conductor, a floating gate overlying the channel and the thin tunneling window, and a control gate conductor insulatively overlying the floating gate, comprising the steps of:
- applying a source inversion control voltage to the source conductor to create an inversion in a source inversion region of the layer of semiconductor, the source inversion region aligned with the source conductor;
- applying a source programming voltage to a source voltage control diffusion region adjacent the source inversion region;
- applying a gate programming voltage to the control gate conductor; and
- in response to said steps of applying voltages charging the floating gate by Fowler-Nordheim tunneling.

12. The method of claim 11, and further comprising the steps of:
- preselecting the source inversion control voltage to be approximately five volts;
- preselecting the source programming voltage to be approximately zero volts; and
- preselecting the gate programming voltage to be +14 to 18 volts.

13. A method for reading an electrically-erasable and programmable read-only memory cell having a source conductor and a drain conductor formed at a face of a layer of a semiconductor and separated by a channel, a thin oxide tunneling window disposed in the channel adjacent the source conductor, a floating gate overlying the channel and the thin tunneling window, and a control gate conductor insulatively adjacent the floating gate, comprising the steps of:
- applying a source inversion control voltage to the source conductor to create an inversion in a source inversion region of the layer of semiconductor, the source inversion region aligned with the source conductor;
- applying a drain inversion control voltage to the drain conductor to create an inversion in a drain inversion region of the layer of semiconductor, the drain inversion region aligned with the drain conductor;
- applying a source reading voltage to a source voltage control diffusion region adjacent the source inversion region;
- applying a drain reading voltage to a drain voltage control diffusion region adjacent the drain inversion region;
- applying a gate reading voltage to the control conductor; and
- in response to said steps of applying voltages, reading the charge on the floating gate by sensing the presence or absence of current flow between the source and drain inversion regions.

14. The method of claim 13, and further comprising the steps of:
- preselecting the source inversion control voltage to be approximately five volts;
- preselecting the drain inversion control voltage to be approximately five volts;
- preselecting the source reading voltage to be approximately zero volts;
- preselecting the drain reading voltage to be approximately 1.5 volts; and
- preselecting the gate reading voltage to be approximately three volts.

15. The method of claim 13, wherein said source and drain reading voltages are applied to diffusion regions remote from the cell.

16. A method of erasing an electrically-programmable and erasable read-only memory cell having a source conductor and a drain conductor formed at a face of a semiconductor, the source conductor and the drain conductor separated by a channel, a thin oxide tunneling window formed in the channel adjacent the source conductor, a floating gate overlying the channel and the thin tunneling window, and a control gate insulatively overlying the floating gate, comprising the steps of:

applying a source inversion control voltage to the source conductor to create an inversion in a source inversion region of the layer of semiconductor, the source inversion region aligned with the source conductor;

applying a drain inversion control voltage to the drain conductor to create an inversion in a drain inversion region of the layer of semiconductor, the drain inversion region aligned with the drain conductor;

applying a source erasing voltage to a source voltage control diffusion region adjacent the source inversion region;

applying a drain erasing voltage to a drain voltage control diffusion region adjacent the drain inversion region;

applying a gate erasing voltage to the control gate conductor; and in response to said steps of applying voltages, discharging the floating gate by Fowler-Nordheim tunneling.

17. The method of claim 16, and further comprising the steps of:

preselecting the source inversion control voltage to be approximately 5 volts;

preselecting the drain inversion control voltage to be approximately 5 volts;

preselecting the source erasing voltage to be approximately 5 volts;

preselecting the drain erasing voltage to be approximately 5 volts; and preselecting the gate erasing voltage to be −8 to −12 volts.

18. The method of claim 16, wherein said source and drain erasing voltages are applied to diffusion regions remote from the cell.

19. A method for using an electrically-programmable and erasable read-only memory cell having a source conductor and a drain conductor formed at a face of a layer of a semiconductor, the source conductor and the drain conductor separated by a channel, a thin oxide tunneling window formed in the channel region adjacent the source conductor, a floating gate overlying the channel and the thin tunneling window, and a control gate conductor insulatively overlying the floating gate, comprising the steps of:

programming the cell, said step of programming comprising the sub-steps of:

applying a source inversion control voltage to the source conductor to create an inversion in a source inversion region of the layer of semiconductor, the source inversion region aligned with the source conductor;

applying a source programming voltage to a source voltage control diffusion region adjacent the source inversion region;

applying a gate programming voltage to the control conductor; and in response to said steps of applying programming voltages, charging the floating gate through Fowler-Nordheim tunneling;

reading the cell, said step of reading comprising the sub-steps of:

applying a source inversion control voltage to the source conductor to create an inversion in a source inversion region of the semiconductor, the source inversion region aligned with the source conductor;

applying a drain inversion control voltage to the drain conductor to create an inversion in a drain inversion region of the layer of semiconductor, the drain inversion region aligned with the drain conductor;

applying a source reading voltage to a source voltage control diffusion region adjacent the source inversion region;

applying a drain reading voltage to a drain voltage control diffusion region adjacent the drain inversion region;

applying a gate reading voltage to the control gate conductor; and in response to said steps of applying voltages, reading the charge on the floating gate by sensing current flow between the source and drain inversion regions; and erasing the cell, said step of erasing comprising the sub-steps of:

applying a source inversion control voltage to the source conductor to create an inversion in a source inversion region of the layer of semiconductor, the source inversion region aligned with the source conductor;

applying a drain inversion control voltage to the drain conductor to create an inversion in a drain inversion region of the layer of semiconductor, the drain inversion region aligned with the drain conductor;

applying a source erasing voltage to a source voltage control diffusion region adjacent the source inversion region;

applying a drain erasing voltage to a drain voltage control diffusion region adjacent the drain inversion region;

applying a gate erasing voltage to the control gate conductor; and in response to said steps of applying voltages, discharging the floating gate by Fowler-Nordheim tunneling.

20. A method of programming at least one cell in an array of memory cells arranged in columns and in rows formed at an angle to the columns, each column of cells having an elongate drain conductor and an elongate source conductor spaced by a channel region therebetween, a thin oxide tunneling window formed in the channel region adjacent the source for each cell, and an adjacent voltage control diffusion region or each respective source and drain conductor, the method comprising the steps of:

applying an inversion control voltage to the source conductor of the column containing the selected cell;

applying a voltage of approximately zero volts to the remainder of the conductors in the array;

applying a source programming voltage to the voltage control diffusion region adjacent the source conductor of the column including the selected cell;

applying a first control gate programming voltage to an elongate control gate of the row containing the selected cell, the control gate insulatively adjacent floating gates overlying the tunneling windows of the cells in the row;

applying a second control gate programming voltage to an elongate control gate of the rows not containing the selected cell, the control gate insulatively adjacent floating gates overlying tunneling windows of the cells in the rows; and responsive to said steps of applying programming voltages, charging the floating gate of the selected cell using Fowler-Nordheim tunneling using the respective thin oxide tunneling window.

21. The method of claim 20, and further comprising the steps of:

preselecting the source inversion control voltage to be approximately 5 volts;

preselecting the first source programming voltage to be approximately 0 volts;

preselecting the first gate programming voltage to be in the range of +16 to +18 volts; and preselecting the second gate programming voltage to be approximately 7 volts.

22. A method of reading at least one cell in an array of memory cells arranged in columns and in rows formed at an angle to the columns, each column of cells having an elongate drain conductor and an elongate source conductor spaced by a channel region, a thin oxide tunneling window formed in the channel region adjacent the source conductor for each cell, a floating gate overlying the thin oxide tunneling window for each cell, and an adjacent voltage control diffusion region for each respective source and drain conductor, the method comprising the steps of:

applying a first inversion control voltage to the source conductor of the column including the selected cell;

applying a second inversion control voltage to the drain conductor of the column including the selected cell;

applying a third inversion control voltage to the remaining conductors in the array;

applying a source reading voltage to the voltage control diffusion region adjacent the source conductor of the column including the selected cell;

applying a drain reading voltage to the voltage control diffusion region adjacent the drain conductor of the column including the selected cell;

applying a first control gate reading voltage to an elongate control gate of the row containing the selected cell, the control gate insulatively adjacent the floating gates of the cells in the row;

applying a second control gate reading voltage to elongate control gates of the rows not containing the selected cell, the control gates insulatively adjacent the floating gates of the cells in the rows; and responsive to said steps of applying reading voltages, reading the charge deposited on the floating gate of the selected cell.

23. The method of claim 22, and further comprising the steps of:

preselecting the first source inversion control voltage to be approximately five volts;

preselecting the second drain inversion control voltage to be approximately five volts;

preselecting the third inversion control voltage of the remaining conductors to be approximately 0 volts;

preselecting the source reading voltage to be approximately 0 volts;

preselecting the drain reading voltage to be approximately 1.5 volts;

preselecting the first control gate reading voltage to be approximately 3 volts; and preselecting the second control gate reading voltage to be approximately 0 volts.

24. A method of bulk erasing an array of memory cells arranged in columns and in rows formed at an angle to the columns, each column of cells having an elongate drain conductor and an elongate source conductor spaced by a channel region, a thin oxide tunneling window formed in the channel region adjacent the source conductor for each cell, and an adjacent voltage control diffusion region for each respective source and drain conductor, the method comprising the steps of:

applying an inversion control voltage to the conductors in the array;

applying a source/drain erasing voltage to the voltage control diffusion regions adjacent the conductors in the array;

applying a control gate erasing voltage to elongate control gates insulatively adjacent floating gates, the floating gates overlying the thin oxide tunneling windows of the cells of the array; and discharging the floating gates in the array by Fowler-Nordheim tunneling using the thin tunneling windows.

25. The method of claim 24, and further comprising the steps of:

preselecting the inversion control voltage to be approximately 5 volts;

preselecting the source/drain erasing voltage to be approximately 5 volts; and preselecting the control gate erasing voltage to be in the range of −8 to −12 volts.

26. The memory cell of claim 1, further including:

a third conductor coupled to said first diffused region; and a fourth conductor coupled to said second diffused region.

27. The memory cell of claim 26, in which said third and fourth conductors are metal lines.

28. The memory cell of claim 26, in which said third conductor is formed over and insulated rom said first conductor and said fourth conductor is formed over and insulated from said second conductor.

29. The array of claim 9, in which said second conductors are metal lines.

30. The array of claim 9, in which each of said second conductors is formed over and insulated from an associated one of said parallel, elongated first conductors.

31. The method of claim 20, and further including the step of allowing all remaining diffused regions in the array to float.

32. The method of claim 20, and further including the step of applying a voltage of approximately zero volts to all remaining diffused regions in the array.

33. The method of claim 22, and further including the step of applying a voltage of approximately 0 volts to the remaining voltage control diffusion regions of the array.

34. A memory cell formed at a face of a semiconductor layer of a first conductivity type, comprising:

first and second conductors overlying said semiconductor layer, said first and second conductors separated by a channel region at said face of said semiconductor layer;

a floating gate conductor overlying and insulated from at least a portion of said channel region;

a control gate conductor overlying and insulated from said floating gate conductor and said channel region;

first and second regions of a second conductivity type opposite said first conductivity type formed in said face remote from said channel region, said first region formed adjacent said first conductor, said second region formed adjacent said second conductor;

said first conductor responsive to an applied voltage to define a first inversion region in said semiconductor layer beneath said first conductor and said second conductor responsive to an applied voltage to define a second inversion region in said semiconductor layer beneath said second conductor.

35. The memory cell of claim 34, in which said floating gate conductor extends over and is insulated from the entire channel region.

36. The memory cell of claim 34, in which said floating gate conductor is insulated from at least said portion of said channel region by an insulator layer having a tunnel window adjacent said second conductor.

37. The memory cell of claim 34, in which said first and second regions are diffused regions.

38. The memory cell of claim 34, in which said first region of said second conductivity type is responsive to an applied voltage to apply a voltage to said first inversion region and said second region of said second conductivity type is responsive to an applied voltage to apply a voltage to said second inversion region.

39. The memory cell of claim 34, further comprising:

a third conductor coupled to said first region of said second conductivity type for applying a voltage to said first region; and a fourth conductor coupled to said second region of said second conductivity type for applying a voltage to said second region.

40. The memory cell of claim 39, in which said third and fourth conductors are metal lines.

41. The memory cell of claim 39, in which said third conductor is formed over and insulated from said first conductor and said fourth conductor is formed over and insulated from said second conductor.

* * * * *